Figure 1:
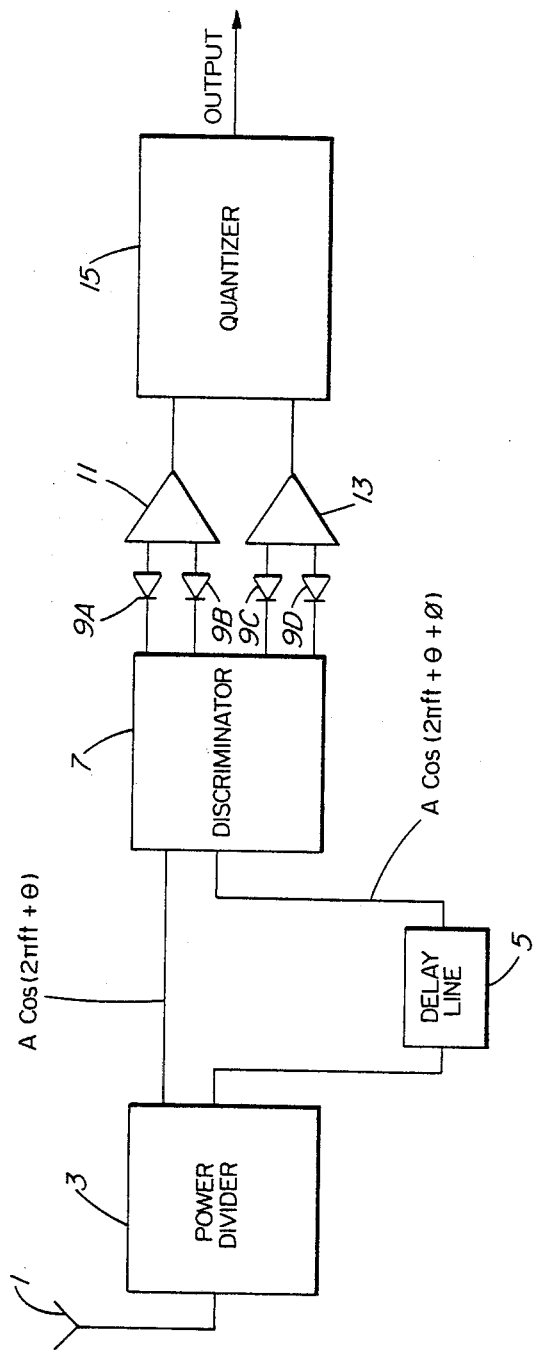

United States Patent [19]

Gagnon et al.

[11] Patent Number: 4,791,360
[45] Date of Patent: Dec. 13, 1988

[54] METHOD AND APPARATUS FOR SIMULTANEOUS INSTANTANEOUS SIGNAL FREQUENCY MEASUREMENT

[75] Inventors: Andre Gagnon, Hull; Myles McMillan, Wakefield; P. Michael Gale, Kanata, all of Canada

[73] Assignee: Telemus Electronic Systems, Inc., Ontario, Canada

[21] Appl. No.: 37,846

[22] Filed: Apr. 13, 1987

[30] Foreign Application Priority Data

Apr. 11, 1986 [CA] Canada .................................... 506511

[51] Int. Cl.[4] ............................................. G01R 33/20
[52] U.S. Cl. ................................ 324/78 D; 324/78 F
[58] Field of Search ................. 324/78 D, 78 F, 77 H, 324/77 B, 77 E; 342/13, 14, 192; 370/29; 307/518, 524

[56] References Cited

U.S. PATENT DOCUMENTS

| | | | |
|---|---|---|---|
| 3,939,411 | 2/1976 | James ................................. | 324/78 D |
| 4,194,206 | 3/1980 | Tsui et al. ......................... | 324/78 F |
| 4,336,541 | 6/1982 | Tsui et al. ............................. | 342/13 |
| 4,426,648 | 1/1984 | Tsui et al. ......................... | 324/77 B |
| 4,459,542 | 7/1984 | Terrier et al. ..................... | 324/77 E |
| 4,547,727 | 10/1985 | Tsui et al. ............................. | 342/13 |

Primary Examiner—Stewart J. Levy
Assistant Examiner—Louis M. Arana
Attorney, Agent, or Firm—Antonelli, Terry & Wands

[57] ABSTRACT

A method and apparatus for performing simultaneous instantaneous signal frequency measurement using a signal sorter in conjunction with a frequency measurement receiver. Simultaneous signals of similar amplitude are received and successively applied to a plurality of either frequency or time dependent signal modifying circuits, via switching circuitry. Respective ones of the received signals are separated with respect to frequency in one or both of amplitude and time from one another via the signal modifying circuits which can be, for instance low pass and high pass filters, or positive and negative dispersive delay lines. In addition, the received signals are applied to a straight-through signal path for transmitting the signals to the frequency measurement receiver unaltered. Signals output from the signal modifying circuits and the straight-through signal path are successively applied to the frequency measurement receiver for detecting the frequency of respective ones of the separated received signals.

30 Claims, 3 Drawing Sheets

METHOD AND APPARATUS FOR SIMULTANEOUS INSTANTANEOUS SIGNAL FREQUENCY MEASUREMENT

This invention relates in general to simultaneous frequency measurement and more particularly to a signal sorter for use in conjunction with a frequency measurement receiver for detecting the respective frequencies of similar amplitude simultaneous signals.

Instantaneous Frequency Measurement (IFM) receivers have been developed for use in electronic warfare, to effect electronic support measures, electronic countermeasures or electronic intelligence applications. Instantaneous frequency measurement receivers are variously known in the art as Digital Instantaneous Frequency Measurement (DIFM) receivers, or Digital Frequency Discriminators (DFDs).

DIFM receivers are typically required to operate in dense electromagnetic signal environments. Consequently, it is desirable that the receivers be capable of receiving, measuring and processing two or more simultaneous signals.

Prior art DIFM receivers typically utilized one or more delay lines to measure signal frequencies over a wide instantaneous bandwidth on a pulse-by-pulse basis, and in response, generated a digital designation of the detected frequency. The receivers typically exhibited the characteristics of wide radio frequency input bandwidth, relatively accurate frequency measurement capability (typically as much as 14 bit resolution over several megahertz), and very wide dynamic range. However, in the event of simultaneous signals, the prior art DIFM receivers typically generated an erroneous frequency output related to harmonics and spurious frequencies of the two or more simultaneous signals.

In order to overcome this disadvantage, wide-band limiting amplifiers have been utilized to restrict frequency detection prior to application of the signals to the DIFM receiver, such that the strongest of the simultaneous signals is transmitted to the receiver while the weaker signals are suppressed. This results in the frequency information pertaining to the weaker signals being lost, and in the event the simultaneous signals are within 6 dB of each other, the DIFM receiver typically detects an erroneous frequency related to the harmonics and spurious frequencies characteristic of the simultaneous signals.

Another prior art approach was to detect the beat frequency of two simultaneous signals using either a mixer or a diode detector, a low pass filter and a comparator, as described for instance in the article of James Bae-Yen Tsui, "Microwave Receivers and Related Components", Avionic Laboratory, Air Force Wright Aeronautical Laboratories, 1983. This approach provided a measure of the amplitude ratio of signals to interference, but gave no information concerning the quality of measurement. Another disadvantage of this approach is that simultaneous signals with frequency separation within the receiver input frequency range cannot be detected. This is because the low pass filter stops the desired input signals and passes only the beat frequency, provided it is lower than the cut-off frequency of the filter. Other drawbacks of beat frequency detection are the inability to detect signals of non-comparable amplitudes or non-coincident leading edges.

A more accurate prior art approach, which was usually implemented in fully automatic systems, involved using a redundant measurement capability for assessing the integrity of each measurement as it was being made. Such schemes have been discussed by James Tsui, Rudy Shaw, James Cisar and Timothy Ratliff in their article "Instantaneous Simultaneous Signal Detecting", Microwave Journal, December 1982. However, the sophisticated receivers which are generally required in order to implement such schemes, suffered from the disadvantages of being very expensive and complex in design.

According to the present invention, frequency dependent signal modification is provided for separating simultaneous signals of similar amplitude in one or both of either amplitude and time, with respect to frequency. The modified or separated signals and the unmodified signals are successively applied to a frequency measurement receiver, such as a DIFM, for successively detecting the individual frequencies of the simultaneous signals.

Thus, according to the present invention, the respective frequencies of simultaneous signals are detected, and frequency information relating to weaker signals is not lost, thereby overcoming the disadvantages of the prior art wide-band limiting amplifier approach. In addition, the system according to the present invention provides detection of simultaneous signals having frequency separation within the receiver input frequency range, and detection of signals of non-comparable amplitudes and non-coincident leading edges, thereby overcoming the disadvantages of the prior art beat frequency detection approach. However, the system according to the present invention is inexpensive and of simple design, in contrast to prior art automatic redundant measuring systems.

Figure 2:
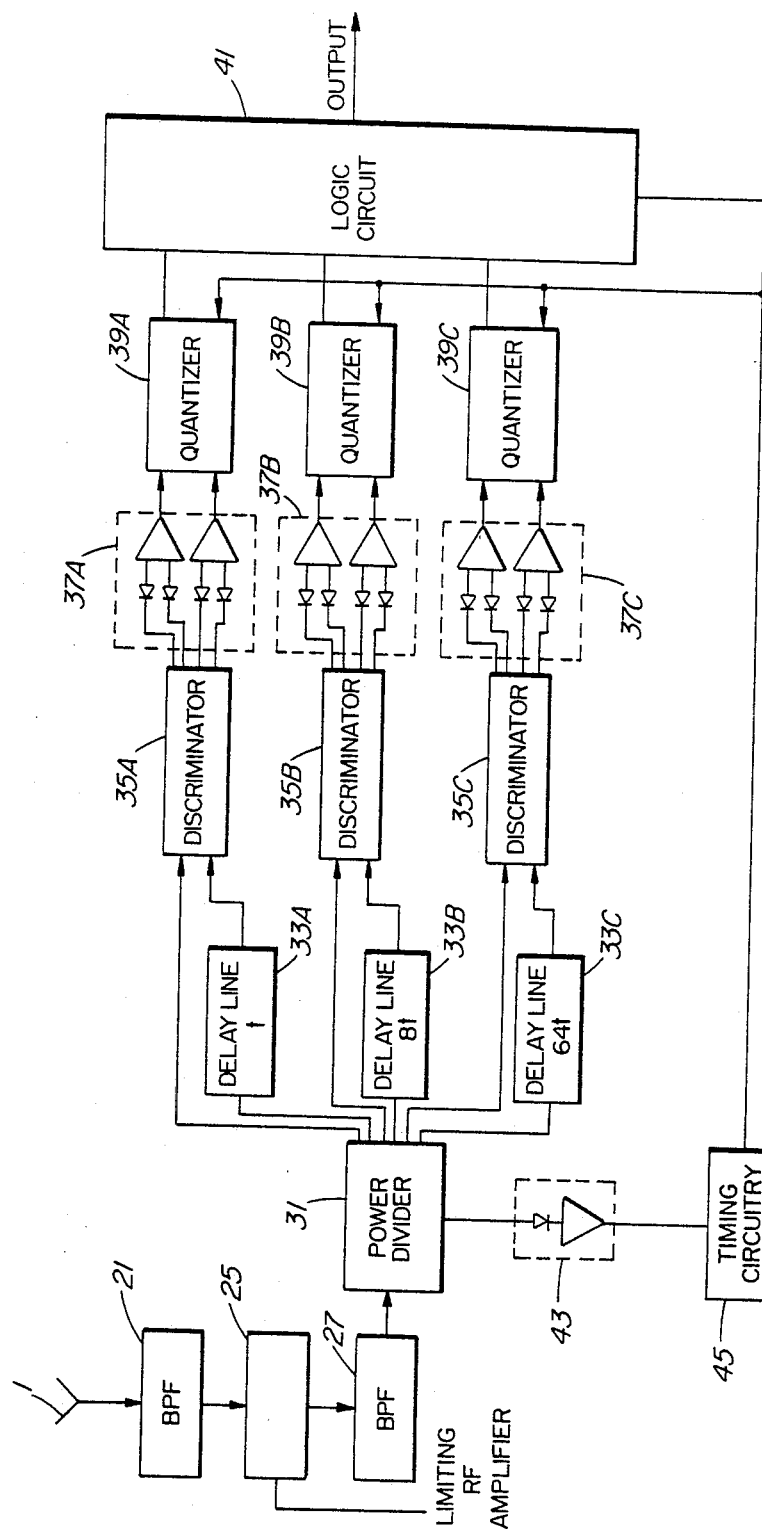
Figure 3:
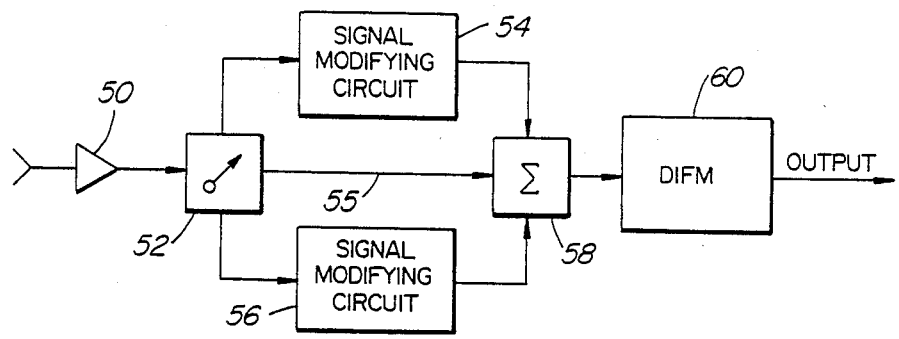
Figure 4:
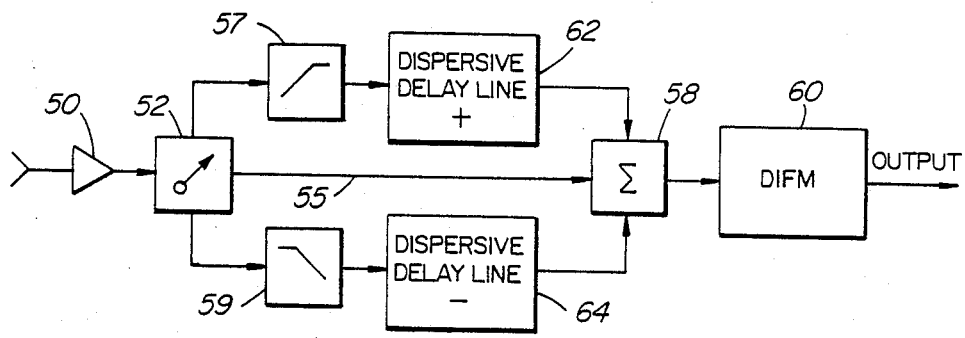
Figure 5:
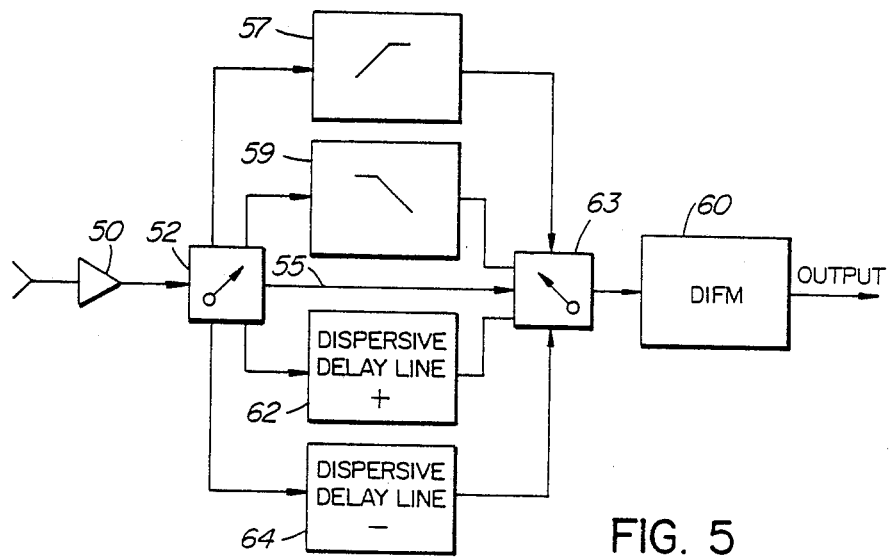

A better understanding of the present invention will be obtained with reference to the detailed description below in conjunction with the following drawings, in which:

FIG. 1 is a block diagram illustrating a single discriminator circuit for use in a DIFM receiver, according to the prior art, FIG. 2 is a block diagram of a DIFM receiver utilizing three discriminator circuits as illustrated in FIG. 1, according to the prior art, FIG. 3 is a block diagram of a simultaneous signal sorter for use with a DIFM receiver according to the present invention in its most general aspect, FIG. 4 is a block diagram of the simultaneous signal sorter according to a first alternative embodiment, and FIG. 5 is a block diagram of the simultaneous signal sorter according to a further alternative embodiment.

With reference to FIG. 1, an incoming signal is received by antenna 1 and applied to a power divider circuit 3 for splitting the received signal into a pair of identical reference signals which can be characterized by the following function with respect to time, t:

$$S = A \cos(2\pi f t + \phi),$$

where:

A represents the amplitude of the received signal,
f represents the frequency of the received signal, and
$\phi$ represents the phase angle of the received signal.

For ease of discussion, it will be assumed that the amplitude (A) and phase angle ($\theta$) of the received signal are constant.

The received signal is applied to a delay line 5, which in response generates an intermediate delayed signal of the form:

$$S' = A \cos(2\pi f t + \theta - \phi),$$
where:

$\phi$ represents the phase angle introduced by the delay line.

The reference signal (S) and delayed signal (S') are applied to a phase discriminator 7. The phase discriminator is a passive component for introducing constant phase angles to each of the reference and delayed signals (S and S') and combining them to form four output signals according to well known techniques.

The output signals are applied to four detectors 9A, 9B, 9C and 9D, and therefrom to a pair of differential input video amplifiers 11 and 13 for converting the output signals from the four detectors to a pair of signals $I = k \cos \phi$ and $Q = k \sin \phi$.

The I and Q signals are applied to a quantizer 15 typically comprised of a bank of comparators (not shown) for generating a digital signal representative of the input phase angle, $\phi$. Respective outputs of the comparators are connected to logic and processing circuits for manipulating the generated digital signal representation of the phase angle $\phi$ to yield a binary representation of the input frequency (f), since the phase angle is a linear function of the input frequency.

In particular, $\phi = 2\pi f t$, where: f represents the frequency of the input signal and $\tau$ represents the delay time imposed by delay line 5.

Since the phase angle $\phi$ is in the range of from 0 to $2\pi$, the frequency is ambiguous for a bandwidth of greater than $1/\tau$. This limits the maximum delay line length for non-ambiguous frequency measurement within a given bandwidth.

In general, a receiver with one delay line of the maximum length cannot unambiguously measure signals with high accuracy over very wide frequency bandwidths. Long delay lines are required for high frequency measurement accuracy. However, as discussed above, the use of long delay lines leads to measurement ambiguities.

The common prior art approach to improving the frequency resolution without ambiguity has been to use a multiple channel receiver with various delay line ratios, in which the long delay line ambiguities are resolved by sequential or parallel measurements on the shorter delay lines.

With reference to FIG. 2, a typical prior art multi-channel DIFM receiver is shown utilizing multiple delay lines. A bandpass filter 21 is connected to antenna 1 for attenuating input signals with frequencies outside a predetermined frequency range. The filtered input signals are then applied to a wide-band limiting radio frequency (RF) amplifier 25 and therefrom to a further bandpass filter 27. The limiting amplifier 25 provides wide input dynamic range, and in the event of simultaneous signals the amplifier amplifies the strongest signal and suppresses the weaker signals such that the receiver typically detects only the presence of the strongest signal, as discussed above.

A second bandpass filter 27 is provided for reducing out of band spurious signals generated by the limiting amplifier 25.

The filtered signal is separated into three main signal paths via a multi-way power divider 31. The three main channels introduce time delays of $\tau$, $8\tau$ and $64\tau$ to the input signal via delay lines 33A, 33B and 33C, respectively.

The power divided input signals and delayed signals are applied to three respective discriminator circuits 35A, 35B and 35C. The outputs of discriminators 35A, 35B and 35C are connected to respective detector and differential amplifier circuits 37A, 37B and 37C which function as discussed above with reference to FIG. 1.

Quantizer circuits 39A, 39B and 39C are provided for digitizing and encoding the outputs of respective differential amplifier and detector circuits 37A, 37B and 37C and generating digital signals representative of the input signal frequency in response thereto.

By increasing the number of channels utilizing delay lines with longer time delays, increased frequency detection resolution is provided. The ambiguities of the long delay lines are resolved by using successively shorter delay lines in conjunction with the longer delay lines. The shortest delay line should preferably be short enough to produce no frequency ambiguity for a given signal frequency bandwidth.

The outputs of quantizers 39A, 39B and 39C are applied to a correction and ambiguity resolving logic circuit 41 for combining the digital signal outputs of the channel quantizers and providing an accurate unambiguous digital signal representing the input signal frequency, while simultaneously correcting discriminator phase measuring errors.

A threshold channel circuit 43 is also provided, typically comprised of a detector and video amplifier connected to a timing circuit 45. The detected signal amplitude is proportional to signal power and in the event this amplitude exceeds a predetermined threshold level, timing circuit 45 is triggered to initiate frequency measurement. After a short time delay for allowing the signal to propagate through the longest delay line discriminator channel, the video signals are quantized and stored.

Theoretically, only two high-quality delay line discriminator channels are required for effecting accurate frequency measurement. However, utilizing fewer delay channels results in poorer system sensitivity and tolerance to interferring signals. It has been found that the highest integrity in dense and complex signal environments is afforded by the use of many channels with delay lines in binary ratios, as discussed in an article by P. W. East and K. A. White, "Complexity/Performance of Trade-Offs in DIFM Receiver Design", proceedings of Military Microwaves, 1978 Conference.

As discussed above, DIFM receivers are typically fairly efficient for accurate frequency analysis over a wide bandwidth. However, they are essentially single channel devices, having low tolerance to interferring signals.

In electronic warfare applications, simultaneous overlap of signals can arise from a plurality of circumstances, such as; the presence of multi-frequency simultaneous pulsed radars, continuous wave and high duty pulsed signals present in the environment, noise and continuous wave jamming signals, impulse coincident and multi-path reflections, spurious receiver generated component signals from preamplifiers or input band translation mixers, and communication signals from satellite or scatter stations.

As discussed above, limiting amplifiers were typically utilized to restrict signal reception by the DIFM receiver to the strongest one of the simultaneous signals. In the event no limiting amplifier is utilized at the input of a receiver, it has been found that a relatively weak signal will affect the frequency measurement of a stronger signal. Use of a limiting amplifier improves the performance of the receiver significantly, causing capture of the weaker signal with as much as 6 dB rejection. However, as discussed above, this suppression effect can greatly restrict the range over which significant errors are observed. Also, increased RF gain is required, together with tighter specifications governing the limiting characteristics and gain flatness of the amplifiers over the input frequency bandwidth in the event RF noise capture problems are to be avoided.

In the event of two signals separated slightly in time, (i.e. simultaneous signals with non-coincident leading edges), wherein the first signal triggers the encoding circuit of a DIFM receiver and the encoding is completed prior to the arrival of the second signal, then the second signal will not affect the frequency measurement of the first signal. However, in the event the second signal arrives prior to the completion of the frequency measurement, and the second signal is stronger than the first one, there is a significant likelihood of the receiver generating an erroneous output signal.

The time delay between the two signals is very critical in relation to the generation of erroneous signals. When the leading edge of the second signal is very close to the first one, the situation is close to the situation wherein the leading edges are coincident.

Noise errors and simultaneous signal errors are additive. The tolerance for both can be improved with low delay line ratios. This requires a greater number of channels and therefore an increase in circuit complexity.

At the expense of system speed performance, signal edge detection can be implemented via the threshold circuit 43 to indicate the detection of overlapping input signal pulses.

According to the principles of the present invention, with reference to FIG. 3, a signal is received via antenna 1 and applied via a frequency limiting power amplifier 50 to a switching circuit 52. Switching circuit 52 is connected to a pair of frequency dependent signal modifying circuits 54 and 56, for separating and isolating respective ones of a pair of simultaneous signals prior to transmitting the received signals to the DIFM receiver 60. The outputs of circuits 54 and 56 are connected to a summing circuit 58 which has an output thereof connected to a DIFM receiver 60 of well known design. A straight-through signal path 55 is also provided between the switching circuit 52 and summing circuit 58. Receiver 60 can for instance be of the form described with reference to either of FIGS. 1 or 2.

The signal modifying circuits 54 and 56 can be for instance high and low pass filters for adjusting the amplitudes of the simultaneous signals with respect to frequency. Alternatively, the circuits 54 and 56 can be positive and negative dispersive delay line circuits for delaying respective ones of the simultaneous signals with respect to frequency, as discussed in greater detail below with reference to FIG. 4.

An example of operation of the circuit according to FIG. 3 will now be described wherein the circuits 54 and 56 are high and low pass filters. In the event of simultaneous input signals of first and second frequencies having approximately equal amplitudes, the signals are alternately applied to high pass and low pass filters 54 and 56 and the straight-through path 55 via switching circuit 52. The gain of the first one of the simultaneous signals is amplified in filter 54 while the remaining signal is attenuated, and the remaining signal is amplified in filter 56 while the first signal is attenuated. The signal outputs from filters 54 and 56 and straight-through path 55 are combined in summing circuit 58 and applied therefrom to a DIFM receiver 60.

In the event of a single frequency input, one of filters 54 or 56 will amplify the signal while the other one of the filters will attenuate it to a level below the threshold value required for triggering detection circuitry (such as circuit 43 discussed with reference to FIG. 2) associated with DIFM receiver 60. Consequently, the receiver 60 will detect the strongest signal present in each of the three paths, (in this case, the single frequency signal).

DIFM receiver 60 alternately detects the combined, first and second input signal frequencies at a rate equal to the switching rate of switching circuit 52, and decision circuitry of the DIFM receiver detects the respective frequencies. It has been found that the optimum switching rate of switching circuit 52 is equal to the minimum signal pulse width of the input signal (in the event of a pulsed input signal) divided by the number of switching paths.

With reference to FIG. 4, an alternative design is illustrated wherein a pair of oppositely poled dispersively delay lines 62 and 64 are connected to a pair of filters 57 and 59 respectively.

Dispersive delay lines are well known circuits for delaying input signals as a function of their frequency. In operation, a dispersive delay line converts an electromagnetic signal propagating at the speed of light to a mechanical wave signal propagating at the speed of sound and applies the mechahical wave signal to a substrate medium. It is known from acoustical research that signals of different frequencies will travel at different speeds through the same medium.

Consequently, in the event of time coincident equal amplitude simultaneous signals of different frequencies (e.g. pulsed radar signals) being applied to the delay lines 62 and 64, a first one of the signals will be delayed a first predetermined amount while the second signal will be delayed a second predetermined amount by delay line 62, while the first signal is delayed the second amount and the second signal is delayed the first amount via delay line 64, thereby separating the time coincident simultaneous signals in time.

The decision circuitry of DIFM 60 determines the correct frequency measurement in response to performing successive frequency measurements of the signals from the straight-through path 55, and the outputs of delay lines 62 and 64, via summing circuit 58.

Thus, the circuit according to either of FIGS. 3 or 4 is capable of improving the capture ratio of simultaneous signals such that the strongest signal may be unambiguously measured even in the event of less than 6 dB difference between the two signals.

A further alternative embodiment of the coincident signal sorter according to the present invention, is illustrated in FIG. 5. High pass and low pass filters 57 and 59 are connected in parallel with positive and negative dispersive delay lines 62 and 64, and the straight-through path 55, each of which are connected to switching circuits 52 and 63. The switching circuit 63 is further connected to DIFM receiver 60 as discussed above. In operation, switching circuits 52 and 63 simultaneously connect successive ones of filters 57 and 59, straight-through path 55, and delay lines 62 and 64 to the receiver 60. The switching time has been found preferably to be equal to the minimum input signal pulse width divided by the number of switching paths.

In the event of simultaneous continuous wave signals of similar amplitude but different frequency, DIFM receiver 60 will detect the frequency of the first one of the signals via filter 57 and a second one of the signals via filter 59, and will detect a non-correlated error signal via the straight-through path 55.

In the event of simultaneous pulsed signals having frequencies which are close to one another such that both are amplified in one of the filters 57 or 59, DIFM receiver 60 may detect an erroneous output signal as a result of being connected to either of the filters or straight-through path 55. However, as discussed above, dispersive delay lines 62 and 64 separate the two signals in time such that receiver 60 measures the frequency of the lower frequency signal in response to being connected to delay line 62, and measures the higher frequency signal in response to being connected to delay line 64.

In the embodiments illustrated in FIGS. 3 and 4, switching circuit 52 is preferably an SP3T type switch, while in the preferred embodiment of FIG. 5 switching circuits 52 and 62 are preferably SP5T type switches.

A person understanding the present invention may conceive of other variations or modifications thereof. For instance, while the embodiments of FIGS. 4 and 5 illustrate the use of dual band frequency band equalization by means of a high pass filter and low pass filter 57 and 59, and delay lines 62 and 64 respectively, a multiplicity of channels may be implemented utilizing for example, a series of bandpass filters tuned to various center frequencies within the input signal bandwidth. Switching circuit 52 (and 63) could also be modified to accommodate the additional channels.

A prescaler or divider chain may be utilized to translate the input microwave frequency signals to RF signals. The coincident signal sorting apparatus and method can then be applied to the RF signals prior to measurement via DIFM receiver 60.

Also, whereas a DIFM receiver 60 was discussed with reference to FIGS. 3, 4 and 5, any appropriate frequency measurement receiver may be utilized according to the present invention.

All such modifications and variations are believed to be within the sphere and scope of the invention as defined by the claims appended hereto.

We claim:
1. A signal sorter, comprised of:
   (a) means for receiving a plurality of simultaneous signals of different frequencies,
   (b) a straight-through signal path for carrying said received simultaneous signals,
   (c) aplurality of frequency dependent signal modifying circuits for isolating respective ones of said simultaneous signals according to their respective frequencies,
   (d) switch means for successively applying said received simultaneous signals to respective ones of said signal modifying circuits and said straight-through path according to a predetermined switching rate, and
   (e) summing means connected to said straight-through path and said signal modifying circuits, for generating a time division multiplexed signal comprised of said simultaneous signal and said isolated ones of said signals in succession, each signal having a duration inversely proportional to said switching rate.

2. A signal sorter as defined in claim 1, wherein each of said signal modifying circuits is comprised of a filter.

3. A signal sorter as defined in claim 1, wherein said plurality of signal modifying circuits is comprised of a low pass filter and a high pass filter, and said switch means is comprised of an SP3T switch for successively applying said received signals to alternate ones of said low pass and high pass filters and said straight-through signal path.

4. A signal sorter as defined in claim 2, further including a plurality of dispersive delay lines connected to respective ones of said filters for delaying respective ones of said isolated signals for predetermined lengths of time proportional to the respective frequencies thereof, whereby respective ones of said simultaneous signals are separated in time.

5. A signal sorter as defind in claim 2, further including a plurality of dispersive delay lines connected in parallel with said filters and said straight-through path to said switch means, for delaying respective ones of said simultaneous signals predetermined respective lengths of time proportional to their respective frequencies, thereby separating said simultaneous received signals in time.

6. A signal sorter as defined in claim 1, wherein each of said signal modifying circuits is comprised of a dispersive delay line for delaying each one of the simultaneous signals from the other ones of said signals a predetermined length of time proportional to their frequencies.

7. A signal sorter as defined in claim 1, wherein said plurality of signal modifying circuits is comprised of a pair of positive and negative dispersive delay lines, and said switch means is comprised of an SP3T switch for successively applying said received signals to alternate ones of said pair of delay lines and said straight-through signal path.

8. A circuit for detecting the frequencies of a pair of simultaneous substantially equal amplitude signals, comprised of:
   (a) means for receiving said signals,
   (b) a first signal modifier for separating said pair of signals in relation to their respective frequencies and applying a first one of said pair of signals to an output thereof,
   (c) a second signal modifier for separating said pair of signals in relation to their respective frequencies and applying the other one of said signals to an output thereof,
   (d) a straight-through signal path for transmitting both of said pair of signals unaltered,
   (e) switch means for successively transmitting said received signals to said first signal modifier, second signal modifier and said straight-through signal path, and
   (f) a frequency measurement receiver connected in a circuit to the outputs of said first and second signal modifiers and to said straight-through path, for receiving said separated first and other one of said signals and said unaltered signals in succession, and generating an output signal indicative of the frequencies of said first and other one of said signals in response thereto.

9. A circuit as defined in claim 8 further including means for summing said separated first and other one of said signals and said unaltered signals and transmitting said summed signals for reception by said frequency measurement receiver.

10. A circuit as defined in claim 8 wherein said first and second signal modifiers are comprised of a low pass and a high pass filter respectively.

11. A circuit as defined in claim 8 wherein said first and second signal modifiers are comprised of a pair of oppositely poled dispersive delay lines.

12. A circuit as defined in claim 10, further including a pair of oppositely poled dispersive delay lines connected to respective outputs of said filters for delaying said first and other one of said signals transmitted by said low pass and high pass filters respectively, by predetermined lengths of time proportional to their respective frequencies.

13. A circuit as defined in claim 10, further including a pair of oppositely poled dispersive delay lines connected in parallel with said filters and said straight-through path to said switch means, for delaying said first and other signals by predetermined lengths of time proportional to their respective frequencies, and a further switch means for successively connecting respective ones of said low pass filter, high pass filter, straight-through path and oppositely poled dispersive delay lines to said frequency measurement receiver.

14. A circuit as defined in claim 8, wherein said switch means is comprised of an SP3T switch.

15. A circuit as defined in claim 13, wherein said switch means is comprised of an SP5T switch.

16. A circuit as defined in claim 12, further including means connected to said oppositely poled dispersive delay lines and said straight-through path, for summing said delayed first and other signals and transmitting said summed signals for reception by said frequency measurement receiver.

17. A circuit as defined in claim 8, wherein said means for receiving is comprised of frequency limiting power amplifier means.

18. A circuit as defined in claim 9, wherein said means for receiving is comprised of frequency limiting power amplifier means.

19. A circuit as defined in claim 15, wherein said means for receiving is comprised of frequency limiting power amplifier means.

20. A simultaneous instantaneous signal frequency measurement circuit, comprised of:
(a) means for receiving a plurality of similar amplitude and time coincident simultaneous signals,
(b) a plurality of gain adjusting means
(c) switch means for successively applying said received signals to respective ones of said gain adjusting means,
(d) said plurality of gain adjusting means including means for amplifying respective ones of said similar amplitude received signals and attenuating remaining ones of said signals, and in response generating time multiplexed versions of respective ones of said received signals separated in frequency and time, and
(e) frequency measurement means for receiving said time multiplexed signals and generating an output signal indicative of the frequency of each of said received simultaneous signals.

21. A circuit as defined in claim 20, further including a plurality of dispersive delay lines connected to respective ones of said gain adjusting means, for delaying each of said time multiplexed signals for a predetermined length of time proportional to their respective frequencies.

22. A circuit as defined in claim 20, further including a plurality of dispersive delay lines connected in parallel with said gain adjusting means to said switch means, for delaying respective ones of said time coincident signals by predetermined lengths of time proportional to their respective frequencies, and further switch means for successively connecting respective ones of said gain adjusting means and dispersive delay lines to said frequency measurement means.

23. A circuit as defined in claim 20, wherein said means for receiving is comprised of frequency limiting power amplifier means.

24. A circuit as defined in claim 20, further including means for summing said time multiplexed signals and applying said summed signals to said frequency measurement receiver.

25. A circuit as defined in claim 20, wherein said frequency measurement means is comprised of a digital instantaneous frequency measurement receiver.

26. A method of separating simultaneous signals having different frequencies and similar amplitudes, comprising the steps of receiving said signals, and successively applying said received signals to respective ones of a plurality of signal modifying means, each signal modifying means including means for isolating a predetermined one of said received signals from the other ones of said signals, and in response generating an output signal corresponding to said isolated one of said simultaneous signals separated in time and frequency from said other ones of the signals, further including the step of dispersively delaying time coincident ones of said simultaneous signals by predetermined lengths of time proportional to their respective frequencies.

27. A method of separating simultaneous signals having different frequencies and similar amplitudes, comprising the steps of receiving said signals, and successively applying said received signals to respective ones of a plurality of signal modifying means, each signal modifying means including means for isolating a predetermined one of said received signals from the other ones of said signals, and in response generating an output signal corresponding to said isolated one of said simultaneous signals spearated in time and frequency from said other ones of the signals, further including the step of filtering similar amplitude ones of said simultaneous signals for amplifying said predetermined one of said signals while attenuating the other ones of said signals.

28. A signal sorter as defined in claim 3, further including a plurality of dispersive delay lines connected to respective ones of said filters for delaying respective ones of said isolated signals for predetermined lengths of time proportional to the respective frequencies thereof, whereby respective ones of said simultaneous signals are separated in time.

29. A signal sorter as defined in claim 3, further including a plurality of dispersive delay lines connected in parallel with said filters and said straight-through path to said switch means, for delaying respective ones of said simultaneous signals predetermined respective lengths of time proportional to their respective frequencies, thereby separating said simultaneous received signals in time.

30. A circuit as defined in claim 16, wherein said means for receiving is comprised of frequency limiting power amplifier means.

* * * * *